United States Patent [19]

Farina et al.

[11] 4,144,479

[45] Mar. 13, 1979

[54] CIRCUIT FOR PROVIDING SAW-TOOTH CURRENT IN A COIL

[75] Inventors: Attilio Farina; Giuseppe Zappalá, both of Turin, Italy

[73] Assignee: Indesit Industria Elettrodomestici Italiana S.p.A., Turin, Italy

[21] Appl. No.: 835,375

[22] Filed: Sep. 21, 1977

[30] Foreign Application Priority Data

Oct. 11, 1976 [IT] Italy .............................. 69437 A/76
Oct. 11, 1976 [IT] Italy .............................. 69438 A/76

[51] Int. Cl.² ...................... H01J 29/70; H01J 29/76
[52] U.S. Cl. ................................... 315/408; 315/399
[58] Field of Search ........................ 315/399, 407, 408

[56] References Cited

U.S. PATENT DOCUMENTS

3,906,307  9/1975  Van Hattum ........................ 315/408

FOREIGN PATENT DOCUMENTS

1466151  3/1977  United Kingdom .................... 315/408

*Primary Examiner*—Theodore M. Blum

*Attorney, Agent, or Firm*—Ladas, Parry, Von Gehr, Goldsmith & Deschamps

[57] ABSTRACT

A circuit for providing a saw-tooth current in a coil is described. The circuit comprises a trace condenser and a retrace condenser which form together with the coil a resonant circuit during the retrace interval, a diode connected parallel to the retrace condenser, a controllable switch connected to a supply source through an inductor and to the retrace condenser through a second diode.

The main feature of this circuit is to comprise a condenser connected on one hand towards the controllable switch and the first inductor and, on the other hand, to a circuit comprising a second inductor and, through a third diode, towards the retrace condenser. The condenser and the two inductors are sized in such a manner that when the controllable switch is not conductive, energy is supplied to the condenser and that successively, when the controllable switch is conductive, the condenser is completely discharged through the second inductor. The energy thus stored in the second inductor is then supplied to a storage device.

12 Claims, 6 Drawing Figures

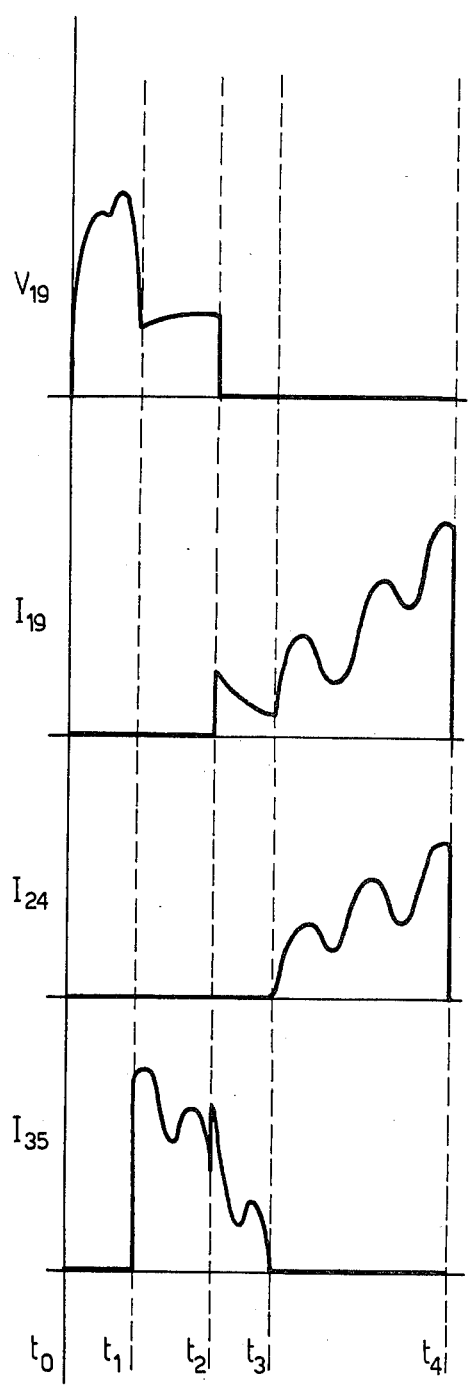
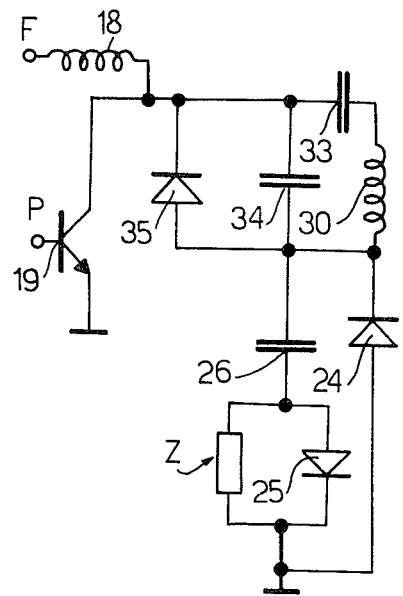
Fig.3
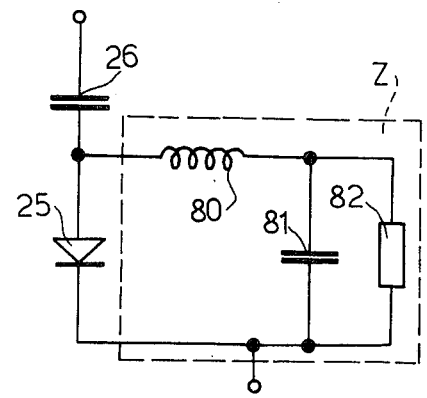
Fig.4
Fig.2

CIRCUIT FOR PROVIDING SAW-TOOTH CURRENT IN A COIL

BACKGROUND OF THE INVENTION

The present invention relates to a circuit for providing saw-tooth current in a coil, in particular the horizontal deflection coil of a cathode ray tube, and for storing part of the energy taken from a supply source, in particular for supplying at least one relatively-low-voltage auxiliary circuit, particularly in a television receiver. The circuit is designed for direct supply from a relatively-high-voltage source, obtained, in particular, by rectifying the alternating mains voltage, and comprises a parallel resonant circuit consisting of said deflection coil and which acts during the retrace interval of the saw-tooth, a first capacity and a second capacity which condition the trace interval and the retrace interval of the saw-tooth respectively, and in which, during the first part of the trace interval, current flows in a first diode connected parallel to the said retrace interval capacitance and, during the second part, in a second diode connected to the first and in a controllable electronic switch connected in series to the second diode, and to whose control electrode pulses are sent periodically to make it conductive for part of the trace interval and in which energy taken from a relatively-high-voltage source is stored in a first inductor, connected to said switch, when the latter is conductive, and transferred, at least partly, to the said resonant circuit, through a third capacitance, during the interval in which the said circuit is not conductive.

Circuits of this type are not unknown (see German Pat. No. 2,130,902, for example) and are very interesting, particularly for makers of television receivers, in that they provide a simple means, using a single switching device which is usually a transistor, of horizontal deflection and supply of low-voltage auxiliary circuits (12 or 25 Volt for example) starting directly with the d.c. voltage obtained by rectifying the 220 V (rms) a.c. domestic mains voltage. The known circuits, such as the one described in the aforementioned German patent or those described in French Pat. No. 2,208,259, use a secondary winding to transfer the energy from the said first inductor to the deflection circuit during the retrace interval; the power for supplying auxiliary circuits can be obtained by introducing further secondary windings and diodes rectifying the pulses produced therein.

As yet, these known circuits have not found any application in practice owing to practical difficulties such as the necessity for two transformers (one for supplying energy to the deflection circuit and to any other auxiliary circuits and one for generating high voltage for the kinescope) and the presence of a sharp initial variation in voltage at the terminals of the switch, when it ceases to be conductive, equal to the supply voltage, or of a high, and therefore undesirable, instantaneous current peak in the switch when it is closed.

SUMMARY OF THE INVENTION

The aim of the present invention is to provide a circuit which will not have the disadvantages of the known circuits.

With this aim in view, the present invention relates to a circuit for providing a saw-tooth current exhibiting a trace interval having an initial, a central and a final part and a retrace interval, in a coil, particularly a deflection coil of a kinescope, comprising, besides the said coil, a trace condenser and a retrace condenser which form together with the said coil a resonant circuit during the retrace interval, a first diode connected parallel to the retrace condenser, with such a polarity that the current of said coil makes it conductive during the initial and central part of the trace interval, a controllable switch provided with a control electrode, connected to a source of periodical signals which make it conductive during the central and the final part of trace interval, said controllable switch being connected to a supply source through a first inductor and to the retrace condenser through a second diode, connected with such a polarity that the current of the said coil makes it conductive during the final part of the trace interval, a first condenser, connected on one hand towards the controllable switch and the first inductor and, on the other hand, to a circuit comprising a second inductor and, through a third diode, towards the retrace condenser; said first condenser and said first and second inductors being sized in such a manner that during the interval in which the said controllable switch is not conductive, energy is supplied by the first inductor to the first condenser which is charged and, successively, during the interval in which the controllable switch is conductive, the first condenser being discharged through the second inductor, so as to be practically discharged at the instant in which the controllable switch becomes non conductive; the energy thus stored in the second inductor being then supplied, during the remainder of the interval, to a storage device.

BRIEF DESCRIPTION OF THE DRAWINGS

Further aims and advantages of the present invention will appear from the following detailed description given in view of making the invention fully understood, with reference to the accompanying drawings which are provided by way of illustrative and non-limiting examples only and in which:

FIG. 2 illustrates a few waveforms to show how the circuit of FIG. 1 operates;

FIG. 3 shows a variation of part of the circuit shown in FIG. 1;

FIG. 4 illustrates in detail a part of the circuits shown in FIGS. 1 and 3;

DETAILED DESCRIPTION OF THE INVENTION

Figure 1:
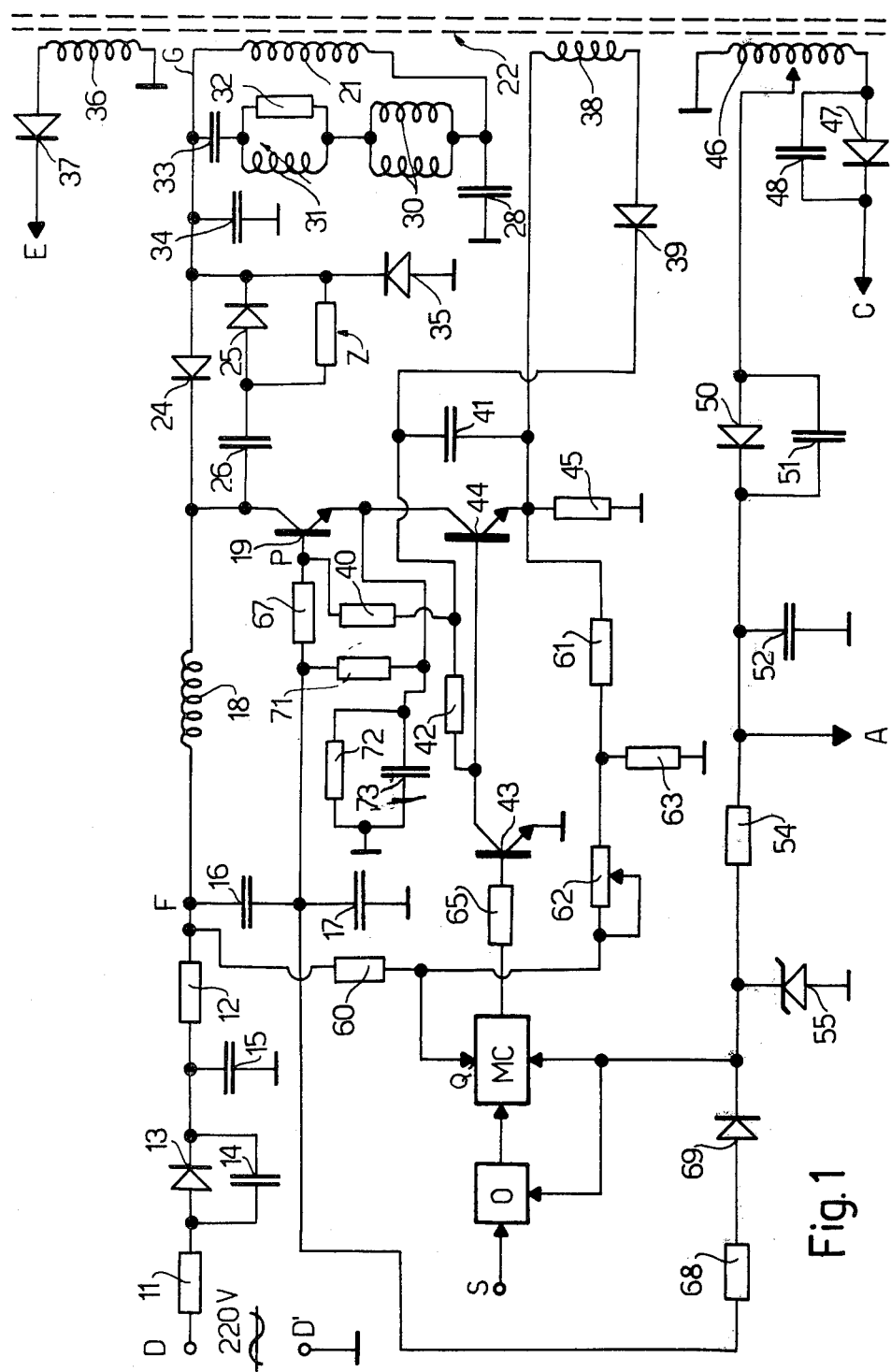
FIG. 1 illustrates an electric diagram of a horizontal deflection and auxialiary circuit supply circuit for a monochromatic 24" 110° screen television receiver embodying the circuit of the present invention.

Referring to FIG. 1, letters D and D' indicate two input terminals of a horizontal deflection and auxiliary circuit supply circuit for a 24" 110° screen monochrome television set. A 220 V – 50 Hz nominal supply voltage (domestic mains voltage) is connected to said terminals D and D'.

Terminal D' is connected to ground; terminal D is connected to a conventional voltage rectifying and levelling circuit consisting of resistors 11 and 12, diode 13 and condensers 14, 15, 16 and 17. In particular, resistor 11 is connected between the terminal D and the anode of the diode 13, parallel to which there is connected the condenser 14. The cathode of the diode 13 is connected, to ground, both through condenser 15 and through the series of the resistor 12 and the condensers 16 and 17.

A d.c. average voltage of roughly 250 V, under nominal conditions, is thus available at point F, that is, at the connection in series between resistor 12 and condenser 16.

Point F is connected, through an inductor 18, to the collector of a NPN transistor 19 (final line transistor). The collector of this transistor 19 is connected to one end G of a primary winding 21 of an extra-high-voltage (EHV) transformer 22 having a number of secondary windings, by means of a network composed of diodes 24 and 25, condenser 26 and component Z, which will be described later in more detail. Diode 24 is connected by the anode to the end G of the primary winding 21 and by the cathode to the collector of the transistor 19; diode 25 is connected by the cathode to the anode of the diode 24 and by the anode to the condenser 26 which, at the other end, is connected to the collector of the transistor 19; finally, component Z is connected parallel to diode 25. The other end of the primary winding 21 of the transformer 22 is connected to ground through a condenser 28 and parallel to said winding 21 is connected the circuit of the horizontal deflection yoke through which has to flow the saw-current, and which is formed by the series of two deflection coils 30 connected parallel (resultant inductance 2 mH), a variable linearity coil 31 (dampened) in parallel to a resistor 32, and a series condenser 33 (for tangent correction). Connected between end G of the primary winding 21 and ground is a parallel condenser 34 for the retrace interval time, and parallel to it is connected also a parallel recovery diode 35 having its anode connected to ground.

Transformer 22 has three secondary windings, namely:

a first booster secondary winding 26, connected between ground and the anode of a diode 37, for obtaining at the cathode of diode 37 (point E) the extra-high-voltage (EHV);

a second secondary winding 38 for biasing the base of the final transistor 19 (through a diode 39 and a resistor 40); namely, one end of the winding 38, connected parallel to which is a condenser 41, is connected to the anode of the diode 39, whose cathode is connected, through resistor 40, to the base of the transistor 19. Moreover, the cathode of diode 39 is connected, through a resistor 42, to the collector of a NPN transistor 43 whose emitter is grounded, and the other end of the winding 38 is connected to the emitter of a NPN transistor 44 which, in its turn, is grounded through a resistor 45;

a third secondary winding 46 for providing low d.c. voltages at points A and C for supplying other circuits on the television set; namely, the winding 46 is connected between the ground and the anode of a diode 47, parallel to which is connected a condenser 48, and whose cathode leads to point C. An intermediate tap of the winding 46 leads to the anode of a diode 50, connected parallel to which is a condenser 51 and whose cathode leads to point A. Connected between point A and ground is a condenser 52. Point A is also connected to one end of a resistor 54 whose other end is connected to the cathode of a Zener diode 55 whose anode is grounded, and to the supply source of two known circuits indicated by letters O and MC and shown in block form, and which represent, respectively, the horizontal oscillator O (which receives the synchronizing signals at an input S) and the control module MC which receives the output of oscillator O and sends to the final line transistor 19, through pilot transistors 43 and 44, a control signal which varies in duration according to the voltage values picked up from point F (through a resistor 60) and from the emitter of the transistor 44 (through a resistor 61 connected to an adjustable resistor 62 and to ground through a resistor 63) and which it receives at an input Q from one end of the resistor 60 and from one end of the adjustable resistor 62. In particular, the output of the control module MC is connected, through a resistor 65, to the base of the transistor 43, whose collector is connected to the base of transistor 44 the collector of which is connected to the emitter of the transistor 19. Thus, control module MC is a pulse width control circuit between the horizontal oscillator and horizontal deflection driver stage and, as such, supplies width-modulated drive pulses to the driver stage varying in length inversely with respect to amplitude changes in the supply voltage at point F and the emitter voltage of transistor 44. Pulse width control circuits suitable for use as control module MC are well known in the art and may be, for example, of the type shown as an oscillator modulator driver in FIGS. 8 and 9 of IEEE Transactions on Broadcast and Television Receivers, pages 177–182, August 1972, Vol. BTR-18, No. 3, or that shown as a duty factor control circuit in FIGS. 3 and 5 of E.A.B. 34 No. 2 (1976), pages 78–89, or that shown as a pulse width control circuit in FIG. 19 of the article "Transistorised Self Stabilising Horizontal Deflection Systems", pages 1–33, in IEEE Transactions BTR 20 (February 1974).

A starter circuit is provided to start the circuit as soon as it is turned on; it supplies the voltage generated at the terminals of condenser 17, at one end, to the base of final transistor 19 (point P) through a resistor 67 and, at the other end, to the O and Mc circuits through a resistor 68 and a diode 69 connected in series.

Between the common connection of condensers 16 and 17 and the emitter of transistor 19 there is connected a resistor 71, whilst between the emitter of the said transistor 19 and ground there is connected the parallel of a resistor 72 and a condenser 73.

FIG. 3 shows diagrammatically a possible variation to the circuit shown in FIG. 1; as can be seen from this FIG. 3, the network composed of diodes 24 and 25, condenser 26 and component Z has been moved over from the hot side of the deflection circuit to the ground side. In fact, said network is no more connected between the collector of transistor 19 and the deflection circuit comprising coil 30, condensers 33 and 34 and diode 35, such a circuit being directly connected to the collector of transistor 19, whilst said network is connected to ground.

FIG. 4 shows in detail the component Z, which is connected parallel to diode 25 both in the circuit shown in FIG. 1 and in the circuit shown in FIG. 3. In fact, connected to the anode of diode 25 is one end of an inductor 80, whose other end is connected to the cathode of diode 25, through a condenser 81 connected parallel to a load 82 which may be a d.c. accessory load, for example the vertical deflection circuit or the audio circuit, or even the heater of the kinescope or the filament of illumination lamps.

Figures 5, 6:
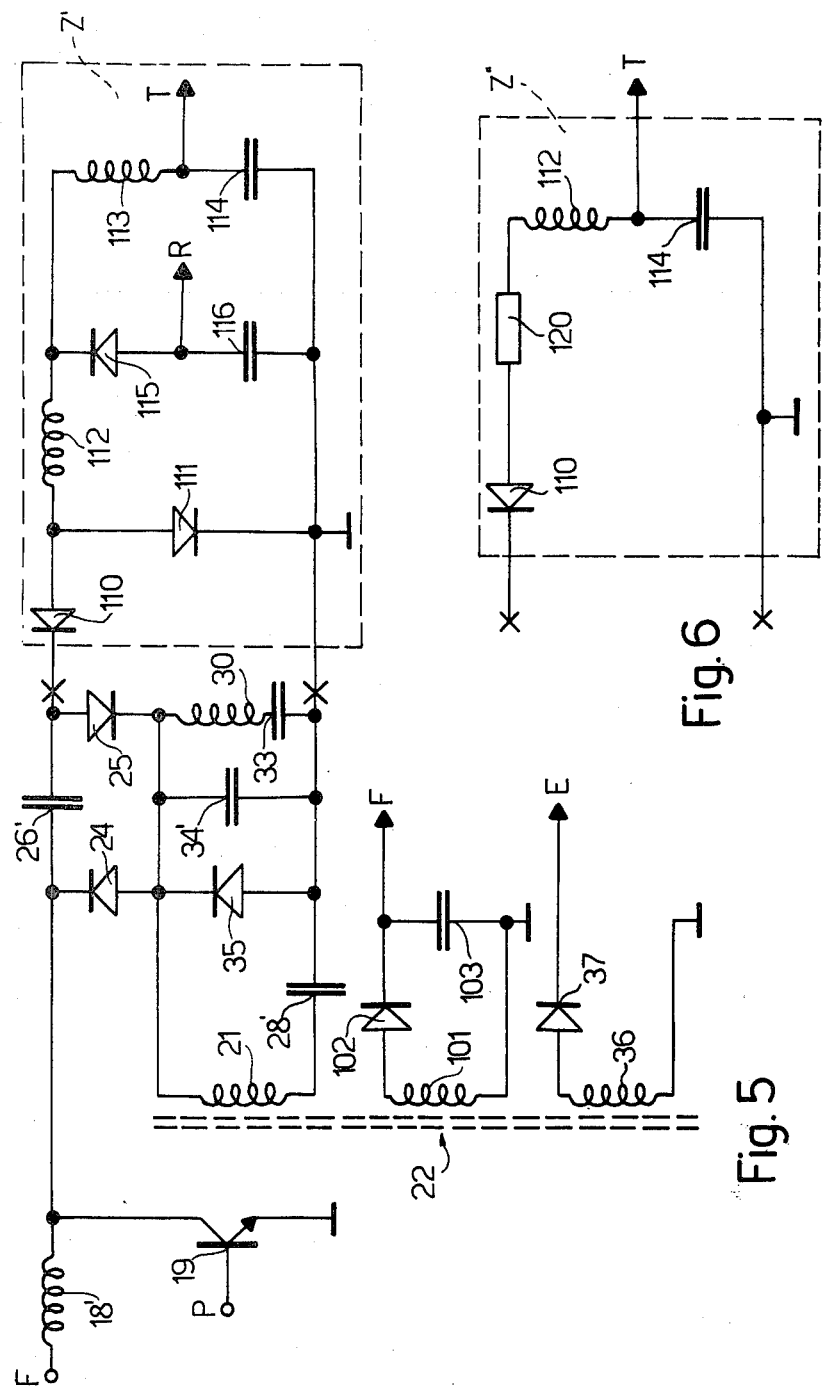
FIG. 5 shows a different embodiment of a part of the diagram of FIG. 1, comprising the circuit of the present invention.
FIG. 6 shows a variation of part of the circuit shown in FIG. 5.

FIG. 5 shows a diagram which comprises the circuit of the present invention, and which imitates, in many, even not shown parts, the diagram shown in FIG. 1.

At point F there is obtained a d.c. voltage which, let us suppose, for the sake of simplicity, is + 275 V ± 20% (+ 330 V and +220 V when the active mains voltage is 264 V and 176 V respectively). Through a first inductor 18', similar to inductor 18, this positive d.c. voltage supplies the collector of the transistor 19, which can cut off under inductive load a peak current of 2.5 A and withstand a maximum crest voltage on the collector of 1500 volts. The said transistor 19 has its emitter connected to ground, and to terminal P, connected to its base, there are applied control pulses of suitable shape and amplitude (according to the transistor maker's instructions) with a repetition frequency equal to the line frequency of the television signal (15625 Hz in Europe, equivalent to 64 microseconds for a complete line scanning cycle).

The length of the said control pulses applied to terminal P can be varied and is controlled, in the known manner, by a control circuit (not shown in FIG. 5 and similar to the corresponding circuit of FIG. 1) which is sensitive to the supply voltage at terminal F and varies the length of the pulses applied to the base of the transistor 19 accordingly (that is, the length of the interval during which the transistor 19 is conductive) in the sense that pulse length increases when supply voltage falls. To make this clearer, in the circuit shown in FIG. 5, pulse length is varied from a minimum of 29 microseconds (corresponding to a r.m.s. mains voltage of 264 V) to a minimum of 44 microseconds (corresponding to a r.m.s. mains voltage of 176 V). In this way, deflection amplitude is stabilized owing to the fact that the power stored in inductor 18', which would tend to fall when supply voltage fell, is brought back to a more or less constant level as a result of increasing the time during which the voltage is applied to it, through transistor 19.

In fact, the energy $\epsilon$ stored in inductor 18' (having the value $L_1$) at the end of a period $\tau$ of application of a voltage V can be calculated using the following equation:

$$\epsilon = \frac{V^2 \tau^2}{2 L_1}$$

So, it can be seen that in order that the energy stored in inductor 18' remains constant, the product $V\tau$ must also be constant.

The collector of the transistor 19 is connected to the deflection circuit (consisting of the parallel formed by deflection coil 30 connected in series to condenser 33, retrace interval condenser 34' similar to condenser 34, and parallel recovery diode 35) over a network consisting of diodes 24 and 25 and condenser 26' similar to condenser 26 of FIG. 1.

Connected parallel to the deflection circuit, through a coupling condenser 28' similar to condenser 28, is the primary winding 21 of the transformer 22. The said transformer, besides having the winding 36 for the EHV to which there is connected the diode 37 and which supplies point E with a d.c. voltage of about 18 KV (in the absence of load), is also provided with a low-voltage secondary winding 101, to one end of which there is connected the anode of a diode 102, whilst a filter condenser 103 is connected between the cathode of the diode 102 and the other end of the winding 101. At the cathode of the diode 102 (point W) there is available a d.c. positive voltage of + 25 V for supplying the circuits of the tuner, the FI amplifier in the television set, the sync signal separator as well as the line and frame collectors.

The total current absorption at point W is roughly 200 mA.

Analogously to the circuit shown in FIG. 1, there is provided, in the known manner, and not shown in FIG. 5, a starter circuit to start the line oscillator on turning on the receiver.

Connected between the anode of the diode 25 and ground is a component Z', similar to component Z. The said component Z' comprises a diode 110 whose cathode is connected to the anode of the diode 25 and whose anode is connected to the anode of a diode 111 having its cathode connected to ground, and to one end of an inductor 112. The other end of the inductor 112 is connected to ground through an inductor 113 and a condenser 114 connected in series, and to the cathode of a diode 115 whose anode is connected to ground through a condenser 116.

From a point R (the anode of the diode 115) and from a point T (connection between inductor 113 and condenser 114) are taken voltages to supply auxiliary circuits.

The operation of the circuit according to the present invention will now be explained with reference first to the diagram of FIG. 5. The operation of the deflection circuit is clearly apparent from FIG. 5: during the initial and central portions (first half) of the trace interval of the saw-tooth the deflection current flows, at a constantly decreasing value, in diode 35, during the final portion (second half), it flows in the opposite direction, at a constantly increasing value, in diode 24 and transistor 19.

The retrace interval starts the instant transistor 19 is blocked (disabled) by the control pulse: with the passage through diode 24 and a transistor 19 cut off, the current from coil 30 flows into condenser 34' charging it to a maximum of roughly 800 positive V. (Coil 30 is 2 mH, peak-peak deflection current roughly 2.7A and condenser 34' 4.3 nF).

At the same time, the current which was circulating in inductor 18' also finds the passage through transistor 19 cut off and also flows into condenser 34' through condenser 26' and diode 25. This energy coming from inductor 18' is used partly to compensate deflection circuit losses (and losses in the circuits and loads connected to it, points W and E) and partly to charge condenser 26'.

Condenser 26', in fact, remains charged at the end of the retrace interval until transistor 19 becomes once more conductive, as time constant defined by inductor 18' ($L_1$) and condenser 26' ($C_1$) is sufficiently great with respect to the non-conductive period of transistor 19. (The value of $L_1$ is 22 mH, $C_1$ 6.8 nF; $2\pi\sqrt{L_1 C_1} = 77$ microseconds).

The instant transistor 19 becomes conductive, condenser 26' discharges rapidly through transistor 19 at one end and the circuit comprising diode 110, inductor 112, diode 115 with condenser 116 and inductor 113 with condenser 114 at the other.

Condensers 114 and 116 are much greater than condenser 26' so that the power of condenser 26' charges inductors 112 and 113 and, instead of returning through diode 110, discharges in condensers 114 and 116 through diodes 111 and 115, this being the easiest way, during the remainder of the cycle.

It is important to note that, if condenser 26' was not discharged, the instant transistor 19 is disabled a sharp jump in voltage would appear at the terminals of the transistor 19 which would aggravate switching conditions considerably. Transistors of this type are known to be subjected to severe conditions and cutting them off to be a particularly critical and delicate operation (see, for example, the publication entitled "High-voltage Output Transistors BU204/205/206 for Horizontal Deflection" by W. M. Dorn and W. Th. H. Hetterscheid in Volume X N° 78 of "Electronic Component Applications").

By means of suitable sizing of the two inductors 112 and 113 in the circuit shown in FIG. 5, two different voltages are obtained at R and T, namely:

at point R, a negative voltage of −23 V with a current of 190 mA for supplying the final vertical deflection stage;

at point T, a negative voltage of −13 V with a current of 320 mA for supplying the amplifier and the final sound stage.

This has enabled optimum use to be made of the energy available from the horizontal deflection circuit and optimum supply of the vertical deflection and sound circuits with the required load impedance; transformer 22 results less overworked than if it was also called upon to transform the power required to supply the vertical deflection and audio stages.

Total mains consumption of the whole set has been measured at only 47 W. Maximum current in transistor 19, at the end of scan, is 1.75 A, and no sharp increases in voltage occur when transistor 19 is cut off.

If the vertical deflection and audio stages had been supplied at the same voltage (e.g. 23 V), the circuit would have been simpler; by simply removing diode 115 and condenser 116 from FIG. 5 and short-circuiting the inductor 112, all the available power could be picked up at point T. The circuit behaves more or less in the same way as a constant-power generator so that by varying load impedance the voltage at the terminals is also varied. If less than maximum available power (in our case roughly 8.5 W) is to be used, diode 111 can be removed; in this case, the current flowing in inductor 112 and/or 113 flows into condenser 116 and/or 114 through diodes 110, 25, 24 and transistor 19 but is cut off the instant transistor 19 is disabled; the remaining available power is then sent back to the supply. However, this increases the maximum current in transistor 19.

To use only part of the power available for supplying auxiliary circuits without increasing the maximum current in transistor 19, the extra power can be dissipated in a resistor, as shown by the variation in FIG. 6, in which the component Z' is replaced by a component Z" which comprises, connected in series to ground, the diode 110, a resistor 120, the inductor 112 and the condenser 114. A voltage of −13 V and a current of 320 mA, that is, roughly 4W, is picked up at point T between the inductor 112 and the condenser 114, in the same way as from point T in FIG. 5, and to prevent increasing the current in transistor 19 the remaining power is dissipated in resistor 120. In this way, the current in inductor 112 falls to almost a negligible level before transistor 19 is disabled.

The operation of the diagram shown in FIG. 1 will now be described with reference, for convenience, to the waveforms illustrated in FIG. 2.

FIG. 2 shows, not to scale, in successive lines:

the curve of the voltage ($V_{19}$) on the collector of final transistor 19;

the curve of the current ($I_{19}$) on the collector of final transistor 19;

the curve of the current ($I_{24}$) in diode 24;

the curve of the current ($I_{35}$) in diode 35.

Five successive instants are marked along the abscissa axis:

$t_o$ which marks the start of the retrace interval (when transistor 19 is disabled);

$t_1$ which marks the end of the retrace interval and the start of the trace interval (when diode 35 starts conducting);

$t_2$ when the final transistor 19 starts conducting;

$t_3$ when diode 35 stops conducting and diode 24 starts;

$t_4$ which marks the end of the trace interval and the start of the new retrace interval (when transistor 19 and diode 24 stop conducting).

The operation of the circuit is as follows.

Between $t_3$ and $t_4$ the saw-tooth deflection current flows in coil 30 at increasing value ranging from zero to a maximum and flows, through coil 31, condenser 33 and condenser 28, in diode 24 and transistor 19 (as well as in condenser 73 between the emitter of transistor 19 and ground); the rise in current is shown in the second and third curve in FIG 2; the waveform superposed on the saw-tooth current comes from the extra-high-voltage secondary winding 36.

At instant $t_4$ (or $t_o$) transistor 19 is disabled by the control pulse; therefore, currents $I_{19}$ and $I_{24}$ are cut off; the retrace interval starts; the deflection current flows to charge condenser 34, which is then discharged again onto coils 30; at the same time, the energy stored in coil 18 flows through condenser 26 and diode 25 to assist in charging condenser 34 and put back into the deflection circuit the energy consumed as a result of passive losses and loads connected to it (supplies A, C and E).

At instant $t_1$ the voltage at the terminals of condenser 34 is once again zero after which it inverts to make diode 35 conductive (curve $I_{35}$ of FIG. 2); condenser 26 remains charged at a given value (see curve $V_{19}$ in FIG. 2, instant $t_1$).

At instant $t_2$ the transistor 19 is made conductive by the control pulse and condenser 26 discharges through transistor 19, diode 35 and component Z. Thus, the current in component Z gives rise, through inductor 80 and condenser 81 which effect a filtering action, to a levelled low voltage for supplying the load 82. Also this load 82 may comprise a resistor to dissipate part of the energy. This brings us back to instant $t_3$, and the cycle ends.

As you can see on curve $V_{19}$ in FIG. 2, the voltage between the collector of transistor 19 and the ground is grater than that at the terminals of condenser 34, during the interval in which transistor 19 is disabled (instants $t_o$ −$t_3$). Consequently, the average value of the first voltage, which is the value of the supply voltage (point F), is greater than the average value of the second voltage.

In the circuit shown in FIG. 1, the average value of the first voltage is roughly 250 V while the average value of the second voltage is roughly 130 V.

The difference between the two voltages varies if instant $t_2$, that is the length of time transistor 19 is conductive, is varied; this is the principle on which the automatic stabilizing circuit works, based on control module MC which senses the voltage at point F and on the emitter of the pilot transistor 44 and varies the conduction time of transistor 19 accordingly, that is, it anticipates or delays the instant $t_2$.

In practice, the circuit shown in FIG. 1 provides a picture of more or less constant amplitude on the television screen with mains voltage between 170 and 260 V (r.m.s.) and beam current variable between zero and 400 μA.

It is to be noted also that the voltage which develops on the collector of the transistor 19 the instant it is disabled ($t_o$) has practically the same variation speed ($dV/dt$) as the voltage which develops at the terminals of the condenser 34, owing to the fact that the collector of transistor 19 is connected to the insulated armature of condenser 34 (which is discharged at $t_o$) through condenser 26 (which has more than twice the capacity of condenser 34) and diode 25 and that at the instant $t_o$ condenser 26 is substantially discharged or charged with very low voltage.

The advantages of the circuit according to the invention will be clearly seen from the description given; it is clear that many variations can be made to the circuits described without, however, departing from the scope of the present invention.

In the following Table there are shown the values of the components of the circuits shown in FIGS. from 1 to 6.

| Resistors | | | Condensers | | |
|---|---|---|---|---|---|
| 11 | 6.8 | Ω | 14 | 1.5 | nF |
| 12 | 68 | Ω | 15 | 100 | μF |
| | | | 16 | 200 | μF |
| 32 | 1.5 | KΩ | 17 | 2200 | μF |
| 40 | 3.3 | Ω | 26 | 10 | nF |
| 42 | 22 | Ω | 28 | 1.5 | μF |
| 45 | 1 | Ω | 33 | 0.33 | μF |
| 54 | 240 | Ω | 34 | 4.7 | nF |
| 60 | 270 | KΩ | 41 | 25 | μF |
| 61 | 2.2 | KΩ | 48 | 330 | pF |
| 62 | 4.7 | KΩ | 51 | 330 | pF |
| 63 | 1.5 | KΩ | 52 | 220 | μF |
| 65 | 1 | KΩ | 73 | 1 | μF |
| 67 | 270 | Ω | | | |
| 68 | 82 | Ω | 26' | 6.8 | nF |
| 71 | 1 | KΩ | 28' | 1.5 | nF |
| 72 | 150 | Ω | 34' | 4.3 | nF |
| | | | 103 | 220 | μF |
| 120 | 27 | Ω | 114 | 2200 | μF |
| | | | 116 | 2200 | μF |
| Diodes | | | Inductors | | |
| 13 | 1N | 4007 | 18 | 14 | mH |
| 24 | BY | 277 | 18' | 22 | mH |
| 25 | BY | 277 | 112 | 1.2 | mH |
| 35 | BY | 223 | 113 | 3.3 | mH |
| 37 | TV | 18 | | | |
| 39 | BY | 296 | Transistors | | |
| 47 | BA | 157 | 19 | BU | 205 |
| 50 | BA | 157 | 43 | BD | 135 |
| 55 | ZPD | 12 | 44 | BD | 435 |
| 69 | 1N | 4001 | | | |
| 102 | BA | 157 | | | |
| 110 | BY | 277 | | | |
| 111 | BY | 277 | | | |
| 115 | BY | 277 | | | |

What we claim is:

1. In a circuit for providing a saw-tooth current exhibiting a trace interval having an initial, a central and a final part and a retrace interval in a coil, particularly a deflection coil of a kinescope, comprising a trace condenser and a retrace condenser which form together with said coil a resonant circuit during the retrace interval, a first diode connected parallel to the retract condenser with such polarity that the current of said coil makes said first diode conductive during the initial and central parts of the trace interval, and a controllable switch provided with a control electrode connected to a source of periodical signals which make said switch conductive during the central and final parts of the trace interval, said controllable switch being connected to a voltage supply source through a first inductor and to the retrace condenser through a second diode connected with such polarity that the current of said coil makes said second diode conductive during the final part of the trace interval, the improvement wherein:
  a first condenser (26 or 26') is connected, at one side thereof, to a common junction of said inductor (18 or 18'), said controllable switch (19) and said second diode (24) and, at the other side thereof, to a common junction of said first diode (35), said second diode (24) and said retrace condenser (34) through a circuit comprising a third diode (25) in parallel with a serially-connected second inductor (80, 112 or 113) and storage device (81, 116 or 114),
  said first condenser and said first and second inductors being respectively of such capacity and inductance that, during nonconductive intervals of said controllable switch, energy is supplied by said first inductor in charging relation to said first condenser and, during each intervening conductive interval of said controllable switch, said first condenser is discharged substantially instantaneously into said second inductor which thereafter supplies its thus stored energy to said storage device for the remainder of said conductive interval.

2. The circuit of claim 1, wherein the energy supplied by said second inductor (112, 113, 80) is transferred to a second condenser (116, 114, 81) for supplying an auxiliary circuit (R, T, 82).

3. The circuit of claim 2, wherein said auxiliary circuit is supplied with a low voltage relative to that of said volatge supply source.

4. The circuit of claim 2, wherein said energy is transferred from said first condenser (26') to said second inductor (112, 113) through a diode (110), during a first part of the interval during which said controllable switch is conductive.

5. The circuit of claim 4, wherein said energy is transferred from said second inductor (112, 113) to said second condenser (116, 114) and to said auxiliary circuit (R, T) through another diode (111, 115), during a second part of the cycle of the saw-tooth, successive to said first part.

6. The circuit of claim 1, wherein energy is transferred from said first inductor (18, 18') to said retrace condenser (34, 34'), during the interval in which said controllable switch (19) is non-conductive, through said first condenser (26, 26') and said third diode (25).

7. The circuit of claim 1, wherein the series connection of said second inductor (112, 113, 80) and storage device (114, 116 or 81) also comprises a resistor (120, 82) for dissipating part of said energy.

8. The circuit of claim 1, wherein said first condenser (26') is connected, at one side thereof, directly to said controllable switch (19) and to the first inductor (18') and, at the other side thereof directly to a terminal of said circuit (Z', Z") comprising said second inductor (112, 113) and to the anode of said third diode (25).

9. The circuit of claim 1, wherein said first condenser (26) is connected, at one side thereof, directly to said controllable switch (19) and to said first inductor (18) and, at the other side thereof, directly to said second inductor (18) and to the anode of said third diode (25) (FIG. 1).

10. The circuit of claim 1, wherein said first condenser (26) is connected, at one side thereof, to said controllable switch (19) and said first inductor (18), through said resonant circuit (30, 33, 34), and, at the other side thereof, directly to said second inductor (80) and through said third diode (25) to the retrace condenser (34) (FIG. 3).

11. The circuit of claim 1, wherein said source of periodical signals for said controllable switch comprises means (MC) for controlling the conduction time of the switch (19) according to the value of the supply voltage given out by said voltage supply source and the value of the current circulating in said switch in order to obtain a stabilization of the amplitude of the said saw-tooth current and of the amplitude of the deflection produced by it.

12. The circuit of claim 1, wherein the said controllable switch comprises a transistor.

* * * * *